(12) United States Patent
Won et al.

(10) Patent No.: US 8,748,865 B2
(45) Date of Patent: Jun. 10, 2014

(54) LIGHT EMITTING DEVICE

(75) Inventors: Jong Hak Won, Seoul (KR); Jong Ho Na, Seoul (KR); Jae In Yoon, Seoul (KR); Hoon ki Hong, Seoul (KR); Se Hwan Sim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/585,481

(22) Filed: Aug. 14, 2012

(65) Prior Publication Data

US 2013/0048944 A1 Feb. 28, 2013

(30) Foreign Application Priority Data

Aug. 24, 2011 (KR) .................. 10-2011-0084721

(51) Int. Cl.
 *H01L 21/00* (2006.01)
 *H01L 21/66* (2006.01)

(52) U.S. Cl.
 USPC ............ 257/13; 257/79; 257/88; 257/14

(58) Field of Classification Search
 USPC ........... 257/13, 15, 14, 88, 79, 89–103, 82
 See application file for complete search history.

(56) References Cited

U.S. PATENT DOCUMENTS

| | | | | |
|---|---|---|---|---|
| 5,670,789 A | * | 9/1997 | Iwata | 257/13 |
| 2008/0203418 A1 | * | 8/2008 | Yanamoto | 257/98 |
| 2011/0291127 A1 | * | 12/2011 | Han et al. | 257/88 |

* cited by examiner

*Primary Examiner* — Chuong A. Luu
(74) *Attorney, Agent, or Firm* — Birch, Stewart, Kolasch & Birch, LLP (57) ABSTRACT

Disclosed are a light emitting device, a method of manufacturing the light emitting device, a light emitting device package and a lighting system. The light emitting device includes a first conductive semiconductor layer; an active layer including a quantum well and a quantum barrier and disposed on the first conductive semiconductor layer; and a second conductive semiconductor layer on the active layer. The active layer includes a first quantum well adjacent to the second conductive semiconductor layer, a second quantum well adjacent to the first quantum well, and a first quantum barrier between the first quantum well and the second quantum well. A recombination rate of electron-hole in the second quantum well is higher than the recombination rate of the electron-hole in the first quantum well, and the first quantum well has an energy level higher than the energy level of the second quantum well.

20 Claims, 5 Drawing Sheets

LIGHT EMITTING DEVICE

CROSS-REFERENCE TO RELATED APPLICATION

This application claims under 35 U.S.C. §119 to Korean Patent Application No. 10-2011-0084721 (filed Aug. 24, 2011) which is hereby incorporated by reference in its entirety.

BACKGROUND

The embodiment relates to a light emitting device, a method of manufacturing the same, a light emitting device package, and a lighting system.

An LED (light emitting device) is an element that converts electric energy into a light energy. For instance, the LED can produce various colors by adjusting the compositional ratio of compound semiconductors.

The LED based on nitride semiconductor thin films is advantageous as compared with conventional light sources, such as a fluorescent lamp or a glow lamp, in terms of power consumption, life span, response speed, safety and environmental-friendly requirement. Thus, application of the LED has been expanded to the extent of an LED backlight that may substitute for a cold cathode fluorescence lamp (CCFL) constituting a backlight of a liquid crystal display (LCD), a white LED lighting device that may substitute for a fluorescent lamp or a glow lamp, a headlight of a vehicle and a signal lamp.

As the application of the nitride semiconductor LED has been expanded, it is necessary to develop the LED having the high power and high efficiency.

Meanwhile, according to a nitride semiconductor LED including an active layer having a multi-quantum well structure of the related art, quantum wells in the active layer may not uniformly distribute carriers injected thereto, so only few quantum wells adjacent to a hole injection layer may contribute to the light emission. Thus, if a great amount of current is injected, extra electrons, which are not effectively confined in the active layer, may be generated.

These extra electrons do not contribute to the light emission, but may be extinguished in the active layer or leaked out of the active layer.

In addition, according to the related art, the recombination of the electron-hole is mainly carried out in the last quantum well adjacent to the hole injection layer. Since the last quantum well has the low light emitting efficiency, the light emitting efficiency of the LED may be lowered.

BRIEF SUMMARY

The embodiment provides a light emitting device, a method of manufacturing the same, a light emitting device package, and a lighting system.

A light emitting device according to the embodiment includes a first conductive semiconductor layer; an active layer including a quantum well and a quantum barrier and disposed on the first conductive semiconductor layer; and a second conductive semiconductor layer on the active layer, wherein the active layer includes a first quantum well adjacent to the second conductive semiconductor layer, a second quantum well adjacent to the first quantum well, and a first quantum barrier between the first quantum well and the second quantum well, and wherein a recombination, rate of electron-hole in the second quantum well is higher than the recombination rate of the electron-hole in the first quantum well.

A light emitting device according to the embodiment includes a first conductive semiconductor layer; an active layer including a quantum well and a quantum barrier and disposed on the first conductive semiconductor layer; and a second conductive semiconductor layer on the active layer, wherein the active layer includes a first quantum well adjacent to the second conductive semiconductor layer, a second quantum well adjacent to the first quantum well, and a first quantum, barrier between the first quantum well and the second quantum well, and wherein a recombination rate of electron-hole in the second quantum well is higher than the recombination rate of the electron-hole in the first quantum well, an energy level of the first quantum well is higher than a recombination energy level of the second quantum well for the electron-hole, and the first quantum barrier has a thickness allowing a tunneling of carriers, which are injected from the second conductive semiconductor layer, through the first quantum barrier.

DETAILED DESCRIPTION OF TOE EMBODIMENTS

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

Embodiment

Figure 1:
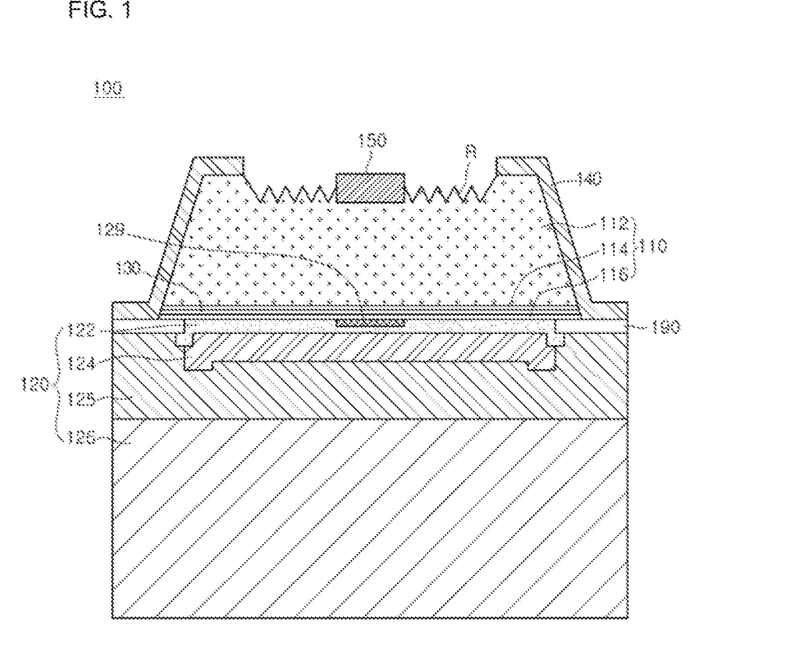
FIG. 1 is a sectional view of a light emitting device according to the embodiment.

FIG. 1 shows the schematic structure of a light emitting device 100 according to the embodiment.

Although the embodiment will be described with reference to a vertical-type light emitting device, this is illustrative purpose only. The embodiment can also be applied to a lateral-type light emitting device, a flip chip-type light emitting device and a hybrid-type light emitting device including a via hole.

The light emitting device according to the embodiment may include a light emitting structure having a first conductive semiconductor layer 112, an active layer 114, and a second conductive semiconductor layer 116, a passivation layer 140 formed on a part of a top surface of the light emitting structure 110 and a first electrode 150 formed on the light emitting structure 110.

According to the embodiment, an electron blocking layer 130 may be disposed between the active layer 114 and the second, conductive semiconductor layer 116.

According to the embodiment, the first conductive semiconductor layer 112 may include a semiconductor material having a compositional formula of $In_xAl_yGa_{1-x-y}N$ ($0 \leq x \leq 1$, $0 \leq y \leq 1$, $0 \leq x+y \leq 1$). For instance, the first conductive semiconductor layer 112 includes at least one selected from the group consisting of GaN, InN, AlN, InGaN, AlGaN, InAlGaN, AlInN, AlGaAs, InGaAs, AlInGaAs, GaP, AlGaP, InGaP, AlInGaP, and InP.

The active layer 114 may have at least one of a single quantum well structure, a multi-quantum well (MQW) structure, a quantum wire structure and a quantum dot structure.

A quantum well/quantum barrier of the active layer 114 may include at least one of InGaN/GaN, InGaN/InGaN, GaN/AlGaN, InAlGaN/GaN, GaAs(InGaAs)/AlGaAs, and GaP (InGaP)/AlGaP, but the embodiment is not limited thereto. The well layer may include a material having a bandgap lower than that of the barrier layer.

The second conductive semiconductor layer 116 may include a compound semiconductor of group III-V elements doped with a second conductive dopant. For instance, the second conductive semiconductor layer 116 may include a semiconductor material having the compositional formula of $In_xAl_yGa_{1-x-y}N$ ($0 \leq x \leq 1$, $0 \leq y \leq 1$, $0 \leq x+y \leq 1$). In detail, the second conductive semiconductor layer 116 may include one selected from the group consisting of GaN, AlN, AlGaN, InGaN, InN, InAlGaN, AlInN, AlGaAs, GaP, GaAs, GaAsP, and AlGaInP.

According to the embodiment, the first conductive semiconductor layer 112 may be an N type semiconductor layer and the second conductive semiconductor layer 116 is a P type semiconductor layer, but the embodiment is not limited thereto. In addition, a semiconductor layer having polarity opposite to polarity of the second conductive semiconductor layer 116 can be formed on the second conductive semiconductor layer 116. For instance, if the second conductive semiconductor layer 116 is a P type semiconductor layer, an N type semiconductor layer (not shown) may be formed on the second conductive semiconductor layer 116. Thus, the light emitting structure 110 may have one of an N-P junction structure, a P-N junction structure, an N-P-N junction structure and a P-N-P junction structure.

A roughness R can be formed on the top surface of the light emitting structure to improve the light extraction efficiency.

A second electrode layer 120 may be formed under the light emitting structure 110. The second electrode layer 120 may include an ohmic layer 122, a reflective layer 124, a bonding layer 125 and a support substrate 126.

For instance, the ohmic layer 122 may include at least one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IZON (IZO Nitride), AGZO (Al—Ga ZnO), IGZO (In—Ga ZnO), ZnO, IrOx, RuOx, NiO, RuOx/ITO, Ni/IrOx/Au, Ni/IrOx/Au/ITO, Ag, M, Cr, Ti, Al, Rh, Pd, Ir, Ru, Mg, Zn, Pt, Au, and Hf, but the embodiment is not limited thereto.

In addition, the reflective layer 124 can be formed by using a metal or an alloy including at least one selected from the group consisting of Ag, Ni, Al, Rh, Pd, Ir, Ru, Mg, Zn, Pt, Au, and Hf. In addition, the reflective layer 124 can be prepared as multi-layers by using the metal or the alloy and transmittive conductive materials, such as IZO, IZTO, IAZO, IGZO, IGTO, AZO, or ATO. For instance, the reflective layer 124 may have a stack structure of IZO/Ni, AZO/Ag, IZO/Ag/Ni, or AZO/Ag/Ni.

The bonding layer 125 may include at least one of Ti, Au, Sn, Ni, Cr, Ga, In, Bi, Cu, Ag and Ta.

in addition, the conductive support substrate 126 may include at least one of copper (Cu), a Cu alloy, gold (Au), nickel (Ni), molybdenum (Mo), copper-tungsten (Cu—W), or a carrier water (e.g. Si, Ge, GaAs, GaN, ZnO, SiGe, or SiC).

A protective member 190 can be formed at an outer peripheral portion of a lower portion of the light emitting structure 110 and a current blocking layer (CBL) 129 can be formed between the light emitting structure 110 and the ohmic layer 122.

The protective member 190 may be formed at the outer peripheral region between the light emitting structure 110 and the bonding layer 125 and may have a ring shape, a loop shape or a rectangular frame shape. A part of the protective member 190 may overlap with the light emitting structure 110 in the vertical direction.

The protective member 190 lengthens the distance between lateral sides of the bonding layer 125 and the active layer 114, thereby preventing the electric short from occurring between the bonding layer 125 and the active layer 114 while preventing the electric short during the chip separation process.

The protective member 190 can be formed by using a material having electric insulating property, a material having electric conductivity lower than that of the reflective layer 124 or the bonding layer 125, or a material forming a schottky contact with the second conductive semiconductor layer 116. For instance, the protective member 190 may include at least one selected from the group consisting of ITO, IZO, IZTO, IAZO, IGZO, IGTO, AZO, ATO, ZnO, $SiO_2$, $SiO_x$, $SiO_xN_y$, $Si_3N_4$, $Al_2O_3$, $TiO_x$, $TiO_2$, Ti, Al and Cr.

The embodiment provides the light emitting device having the improved light emitting efficiency, the method of manufacturing the light emitting device, the light emitting device package and the lighting system.

To this end, the light emitting device 100 according to the embodiment includes the first conductive semiconductor layer 112, the active layer 114 including the quantum well and the quantum barrier and formed on the first conductive semiconductor layer 112, and the second conductive semiconductor layer 116 formed on the active layer 114. The active layer 114 includes a first quantum well 114w1 closest to the second conductive semiconductor layer 116 and a second quantum well 114w2 closest to the first quantum well 114w1, in which the recombination rate of the electron-hole in the second quantum well 114w2 is higher than the recombination rate of the electron-hole in the first quantum well 114w1.

The active layer 114 may include a first quantum barrier 114b1 between, the first quantum well 114w1 and the second quantum well 114w2. The first quantum barrier 114b1 may have a carrier transfer power higher than that of other barrier wall, for instance, a second quantum barrier 114b2.

The first quantum well 114w1 may have an energy level higher than that of the second quantum well 114w2.

The first quantum well 114w1 may have a compositional ratio different from that of the second quantum well 114w2. For instance, an indium (In) ratio of the first quantum well 114w1 may be lower than that of the second quantum well 114w2.

In detail, the indium (In) ratio of the first quantum well 114w1 may be about 9 to 10%, and the indium (In) ratio of the second quantum well 114w2 may be about 12%, but the embodiment is not limited thereto.

In addition, the first quantum well 114w1 may be grown under the growth temperature higher than that of the second quantum well 114w2. For instance, the first quantum well 114w1 is grown while increasing the temperature by about 6° C. to 9° C. from the normal growth temperature, so that the crystallinity of the first quantum well 114w1 can be improved.

Figure 2:
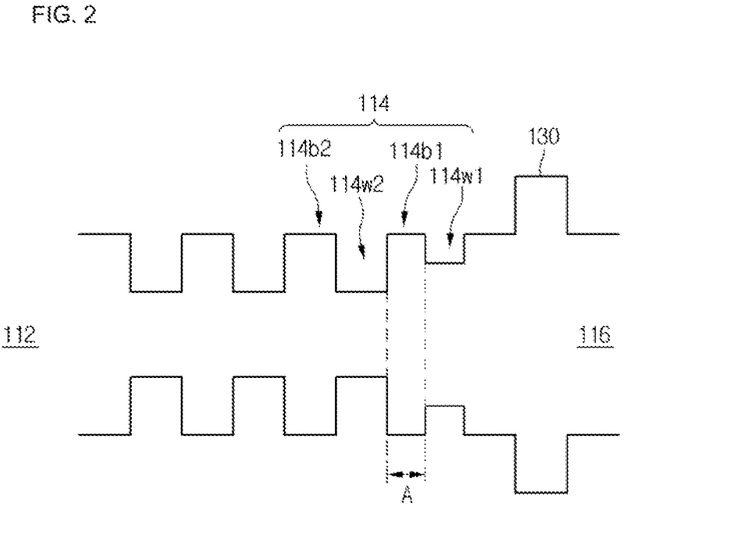
FIG. 2 is an energy band diagram of a light emitting device according to the first embodiment.

FIG. 2 is an energy band diagram of the light emitting device according to the first embodiment.

In general, the probability of recombination of the hole-electron is highest in the last quantum well adjacent to the hole injection layer due to the low mobility of the hole.

However, the last quantum well is thermally damaged while a p-AlGaN/p-GaN layer is being grown in the high temperature or the last quantum well is damaged due to the diffusion of Mg, which is P type impurity, so the recombination efficiency is relatively low as compared with other quantum wells.

Thus, the light emitting device must be designed such that the carrier, especially, the hole can be injected into other wells rather than the last well in order to manufacture the light emitting device having the high efficiency.

According to the embodiment, when the first quantum well 114w1 serving as the last quantum well is grown, the growth temperature is increased to allow the first quantum well 114w1 to have the composition different from the composition of other quantum wells. For instance, when the first quantum well 114w1 is grown, the temperature is increased by about 6° C. to 9° C. from the normal growth temperature.

According to the embodiment, since the first quantum well 114w1 is grown under the high growth temperature, the crystallinity of the last quantum well, in which the probability of the recombination is high, can be improved.

In addition, according to the embodiment, the first quantum well 114w1 has a shallow depth to facilitate the escape of the hole, so that the hole injection can be induced to other quantum wells having the superior light emitting efficiency.

Therefore, according to the embodiment, the brightness of the LED can be improved.

According to the embodiment, in order to improve the light emitting efficiency of the light emitting device, the quantum barrier between the last well and the well located at the very below of the last well may have a thin thickness to prevent the recombination in the last well having a relatively low light emitting efficiency.

According to the embodiment, since the thickness of the barrier between the first quantum well 114w1 serving as the last well and the second quantum well 114w2 serving as the next well is reduced, the holes, which are escaped without being recombined in the first quantum well 114w1 serving as the last well having the shallow depth, can easily migrate to the second quantum well 114w2, which is located at the very below of the first quantum well 114w1, without resistance. Thus, a greater amount of holes can be injected into the second quantum well 114w2 having the superior light emitting efficiency, so the light emitting efficiency of the light emitting device can be improved.

According to the embodiment, the first quantum barrier 114b1 may be disposed between the first quantum well 114w1 and the second quantum well 114w2, and the first quantum barrier 114b1 has the carrier transfer power higher than that of other quantum barriers. For instance, the first quantum barrier 114b1 may have the thickness of about 4 nm, which is thinner than the thickness (6 nm) of other quantum barriers, and the thickness of the barrier between the first quantum well 114w1 serving as the last well and the second quantum well 114w2 serving as the next well is reduced, so the holes, which are escaped without being recombined in the first quantum well 114w1 serving as the last well having the shallow depth, can easily migrate to the second quantum well 114w2, which is located at the very below of the first quantum well 114w1, without resistance. Thus, a greater amount of holes can be injected into the second quantum well 114w2 having the superior light emitting efficiency, so the light emitting efficiency of the light emitting device can be improved.

According to the embodiment, if the energy level of the first quantum well 114w1 is higher than the energy level of the second quantum well 114w2, the thickness of the first quantum barrier 114b1 is sufficient for preventing the tunneling of the carriers, which are injected from the second conductive semiconductor layer 116, through the first quantum barrier 114b1.

For instance, the first quantum, barrier 114b1 may be a GaN quantum barrier having the thickness of about 3 nm to about 4 nm, which is thinner than the thickness (6 nm) of other quantum barriers, but the tunneling of the carrier through the first quantum barrier 114b1 may not occur.

According to the embodiment, in the case that the second conductive semiconductor layer 116 is the P type semiconductor layer, the growth temperature of the P type semiconductor layer is about 900° C. to 1000° C., which is higher than the growth temperature (about 700° C. to 800° C.) of the active layer 114, so the interracial surface of the active layer 114 may be exposed to the high temperature if the temperature is increased to the growth temperature of the P type semiconductor layer after the active layer 114 has been grown.

In addition, when the P type semiconductor layer is grown, the P type dopant may diffuse into the adjacent active layer. Thus, in general, the interfacial surface of the active layer adjacent to the P type semiconductor layer may be thermally damaged or the active layer may be damaged due to the diffusion of the P type dopant, so the light emitting efficiency of the active layer may be lowered as compared with the light emitting efficiency of other active layers.

Therefore, according to the embodiment, when the P type semiconductor layer 150 may be formed on the active layer 140, the recombination rate of the electron-hole in the quantum well 114w1 of the active layer 140, which is damaged due to the growth temperature of the P type semiconductor layer 150, that is, the recombination rate of the electron-hole in the first quantum well 140w1 closest to the P type semiconductor layer 150 is reduced and the recombination rate of the electron-hole in the next quantum well, that is, the recombination rate of the electron-hole in the second quantum well 140w2 closest to the first quantum well 140w1 is increased, thereby improving the light emitting efficiency of the light emitting device.

Figure 3:
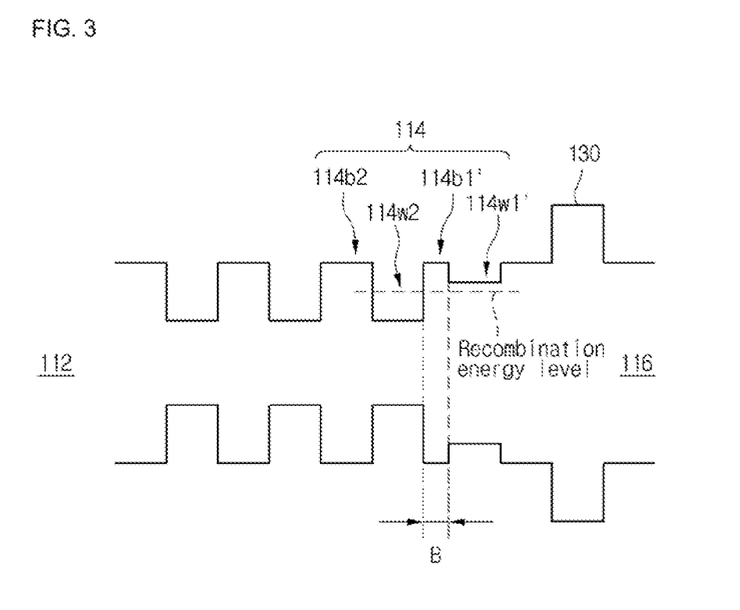
FIG. 3 is an energy band diagram of a light emitting device according to the second embodiment.

FIG. 3 is an energy band diagram of a light emitting device according to the second embodiment.

The light emitting device according to the second embodiment may adopt the technical features of the light emitting device according to the first embodiment.

According to the second embodiment, if the energy level of a first quantum well 114w1' is higher than the energy level of a second quantum well 114w2' for recombination of the electron-hole, the first quantum barrier 114b1' may have a thickness allowing the tunneling of the carriers, which are injected from the second conductive semiconductor layer 116, through the first quantum barrier 114b1'.

According to the second embodiment, the thickness of the first quantum, barrier 114b1' between the first quantum well 114w1' serving as the last quantum well and the second quantum well 114w2' adjacent to the first quantum well 114w1' is thin (for instance, 3 nm or less) sufficient for allowing the tunneling of the carriers. Thus, most of charges (especially, holes) may migrate from the first quantum well 114w1' to the second quantum well 114w2' adjacent to the first quantum well 114w1'. That is, since the recombination occurs in the second quantum well 114w2' having the superior quantum efficiency, the optical power can be increased.

In addition, according to the second embodiment, since the light having the short wavelength is not generated from the first quantum well 114w1' serving as the last quantum well, the problem related to the increase of the width of the spectrum can be solved.

Further, according to the second embodiment, the energy level of the energy bandgap of the first quantum well 114w1' serving as the last quantum well must be higher than the recombination energy level of remaining wells. If this condition is not satisfied, a thick well corresponding to two wells combined with each other may be provided and the thick well may lower the recombination efficiency.

According to the second embodiment, the depth of the first quantum well 114w1', which is a sacrificed quantum well, can be controlled by increasing the process temperature or the composition of indium (In) and the well depth can be more lowered.

According to the second embodiment, the thickness of the first quantum barrier 114b1' allowing the tunneling of the carriers may vary depending on the structure of the device, composition of the layer and crystallinity. For instance, if the first quantum barrier 114b1' is a GaN based quantum barrier, the first quantum barrier 114b1' may have the thickness of about 3 nm to 4 nm or less. If the first quantum barrier 114b1' is an AlGaN based quantum barrier, the thickness of the first quantum barrier 114b1' may be more reduced than the thickness of GaN based quantum barrier because an band gap energy level of the AlGaN based quantum barrier is higher than an band gap energy level of the GaN based quantum barrier. The thickness of the first quantum barrier 114b1' may be reduced as the composition of Al is increased.

According to the second embodiment, the first quantum barrier 114b1' having the thickness allowing the tunneling of the carriers may not serve as a barrier in terms of the quantum mechanics. This first quantum barrier 114b1' may be defined as an interfacial surface holding layer that forms and holds a discontinuous and sharp interfacial surface between the sacrificed last quantum well and the second quantum well 114w2 serving as a main light emitting well.

Figure 4:
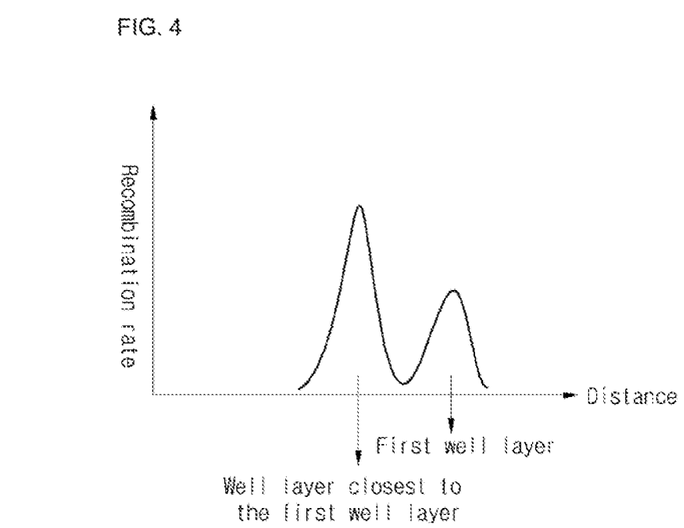
FIG. 4 is a graph showing a recombination rate in a light emitting device according to the embodiment.
Figure 5:
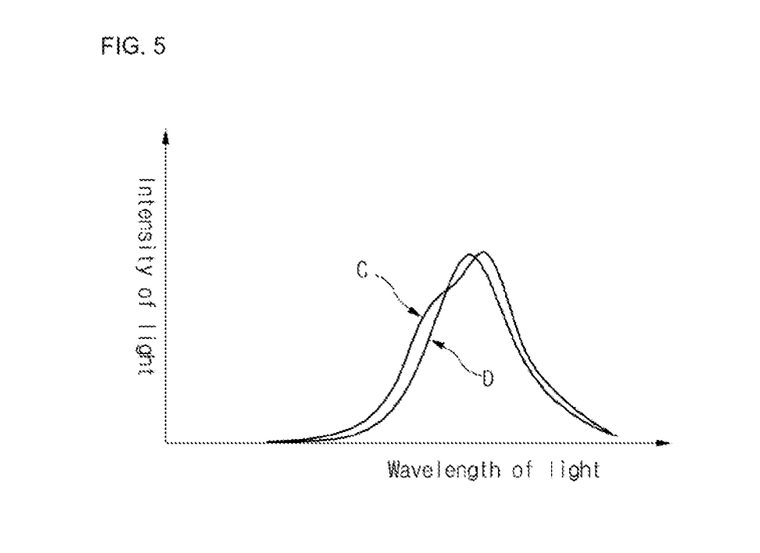
FIG. 5 is a graph showing a light emission spectrum in a light emitting device according to the embodiment.

FIG. 4 is a graph showing the recombination rate in the light emitting device according to the embodiment and FIG. 5 is a graph showing a light emission spectrum in the light emitting device according to the embodiment.

In general, the recombination rate of the electron-hole in the quantum well closest to the second conductive semiconductor layer is significantly higher than the recombination rate of the electron-hole in other quantum wells of the active layer. A distance of x-axis in the FIG. 4, means that a distance from the first conductive layer 112 to the active layer 114.

According to the embodiment, as shown in FIG. 4, the recombination rate of the electron-hole in the first quantum well 114w1 is lower than the recombination rate of the electron-hole in the second quantum well 114w2 closest to the first quantum well 114w1.

In addition, as shown in FIG. 5, according to the embodiment, the light emitted from the active layer 114 may have the single wavelength (D) as the recombination rate in the first quantum well 114w1 is lowered. If the recombination rate in the first quantum well 114w1 is high, the spectrum width may be significantly increased although the light emitting efficiency of the active layer 114 can be improved, so the light may have no single wavelength (C), deteriorating the color purity.

FIG. 5 is obtained under the condition that the recombination rate of the electron-hole in the first quantum well 114w1 is higher than the recombination rate of the electron-hole in the second quantum well 114w2 closest to the first quantum well 114w1.

For instance, as shown in FIG. 2, when the floor energy level of the first quantum well 114w1 is higher than the floor energy level of the second quantum well 114w2 and the first quantum barrier 114b1 has a thickness sufficient for preventing the tunneling of the holes, the recombination, rate of the electron-hole in the first quantum well 114w1 is lower than the recombination rate of the electron-hole in the second quantum well 114w2 closest to the first quantum well 114w1. In this case, the light emitting device according to the embodiment has the highest light emitting efficiency and the light has the single wavelength.

In addition, as shown in FIG. 3, when the floor energy level of the first quantum well 114w1' is higher than the recombination energy level of the second quantum well 114w2 for the electron-hole and the first quantum barrier 114b1' has a thickness allowing the tunneling of the holes through the first quantum barrier 114b1', the recombination rate of the electron-hole in the first quantum well 114w1' is minimized and the recombination rate of the electron-hole in the second quantum well 114w2 closest to the first quantum well 114w1' is maximized. In this case, the light emitted from the active layer 114 has the single wavelength.

According to the embodiment, in order to prevent the degradation of the color purity, the thickness of the first quantum barrier 114b1' is adjusted to enable the tunneling of the holes through the first quantum barrier 114b1'. For instance, the first quantum barrier 114b1' may have the thickness of about 3 nm or less. The first quantum barrier 114b1' may have the thickness of about 0.5 nm, but the embodiment is not limited thereto.

Therefore, most of carriers (especially, holes) may migrate from the first quantum well 114w1' serving as the last quantum well to the second quantum well 114w2 adjacent to the first quantum well 114w1'. That is, since the recombination of the electron-hole is carried out in the second quantum well 114w2, the optical power can be improved. In addition, since the light having the short wavelength may not be generated from the first quantum well 114w1' serving as the last quantum well the problem related to the increase of the spectrum width can be solved.

According to the embodiment, the band energy level of the first quantum well 114w1' serving as the last quantum well is set to be higher than the recombination energy level of remaining quantum wells. If this condition is not satisfied, a thick well corresponding to two wells combined with each other may be provided and the thick well may lower the recombination efficiency. The band energy of the first quantum well 114w1' serving as the last quantum well can be controlled by increasing the process temperature or reducing the composition of indium (In).

According to the embodiment, the first quantum well 114w1' serving as the last quantum well may have a thickness in the range of about 0.5 nm to about 3.2 nm, but the embodiment is not limited thereto. If the vertical type light emitting device or the lateral type light emitting device is manufactured according to the embodiment, the light emitting efficiency can be improved even if the interfacial surface of the active layer is damaged by the growth temperature of the conductive semiconductor layer formed nest to the active layer and the dopant. In addition, the light emitting device can generate the light having the single wavelength with the higher light emitting efficiency.

Figure 6:
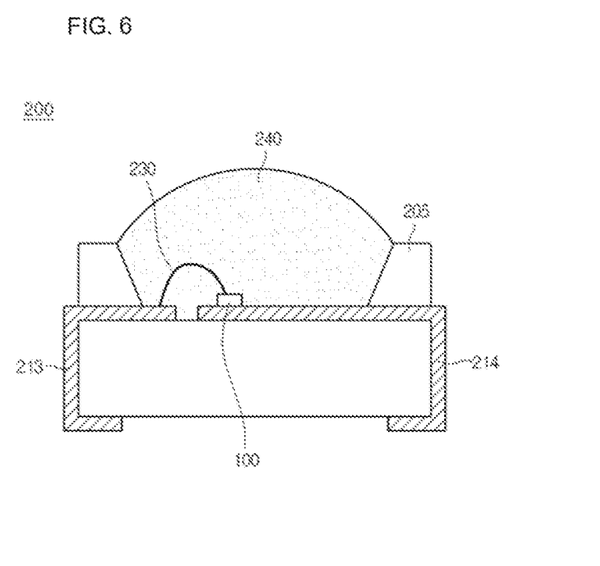
FIG. 6 is a sectional view showing a light emitting device package including a light emitting device according to the embodiment.

FIG. 6 is a sectional view showing a light emitting device package 200 including the light emitting device according to the embodiment.

The light emitting device package 200 according to the embodiment includes a package body 205, third and fourth electrode layers 213 and 214 formed on the package body 205, the light emitting device 100 according to the embodiment, which is installed in the package body 205 and electrically connected to the third and fourth electrodes 213 and 214, and a molding member 240 surrounding the light emitting device 100.

The package body 205 may include silicon, synthetic resin, or metallic material. An inclined surface may be formed around, the light emitting device 100.

The third and fourth electrode layers 213 and 214 are electrically insulated from each other and supply power to the light emitting device 100. The third and fourth electrode layers 213 and 214 may reflect light emitted from the light emitting device 100 to increase light efficiency, and may dissipate heat generated from the light emitting device 100 to the outside.

The light emitting device 100 may include a vertical type light emitting device shown in FIG. 1, but the embodiment is not limited thereto. For instance, the light emitting device 100 may include a lateral type light emitting device.

The light emitting device 100 may be mounted on the package body 205 or on the third electrode 213 or the fourth electrode 214.

The light emitting device 100 may be electrically connected with the third electrode 213 and/or the fourth electrode 214 through one of a wire scheme, a flip chip scheme and a die bonding scheme. According to the embodiment, the light emitting device 100 is electrically connected to the third electrode 213 through a wire 230 and directly makes contact with the fourth electrode 214.

The molding member 240 may protect the light emitting device 100 by surrounding the light emitting device 100. In addition, the molding member 240 may include phosphors to change the wavelength of light emitted from the light emitting device 100.

A plurality of light emitting device packages according to the embodiment may be arrayed on the substrate. In addition, optical members, such as a light guide plate, a prism sheet, a diffusion sheet, and a fluorescence sheet, may be installed on the path of a light emitted from the light emitting device package. The light emitting device package, the substrate and the optical members may serve as a backlight unit or a lighting unit. For example, a lighting system may include a backlight unit, a lighting unit, an indicator, a lamp, or a street lamp.

Figure 7:
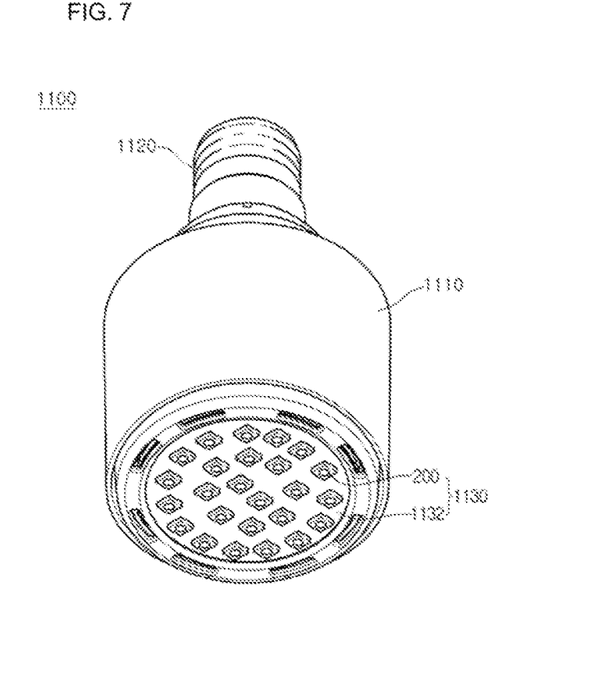
FIG. 7 is a perspective view showing a lighting unit including a light emitting device package according to the embodiment.

FIG. 7 is a perspective view showing a lighting unit 1100 according to the embodiment. The lighting unit 1100 of FIG. 7 is one example of a lighting system, and the embodiment is not limited thereto.

According to the embodiment, the lighting unit 1100 according to the embodiment may include a case body 1110, a light emitting module 1130 installed in the case body 1110, and a connection terminal 1120 installed in the ease body 1110 to receive power from an external power source.

Preferably, the case body 1110 includes a material having a superior heat dissipation property. For example, the case body 1110 may include a metallic material or a resin material.

The light emitting module 1130 may include a substrate 1132 and at least one light emitting device package 200 installed on the substrate 1132.

The substrate 1132 may be formed by printing a circuit pattern on an insulator. For example, the substrate 1132 may include a PCB (Printed Circuit Board), a metal core PCB, a flexible PCB, or a ceramic PCB.

In addition, the substrate 1132 may include a material that effectively reflects the light. A coating layer may be formed on the surface of the substrate 1132. At this time, the coating layer has a white color or a silver color to effectively reflect the light.

At least one light emitting device package 200 is installed on the substrate 1132. Each light emitting device package 200 may include at least one LED (light emitting diode) 100. The LED 100 may include a color LED that emits the light having red, green, blue or white color and a UV (ultraviolet) LED that emits UV light.

The light emitting device package 200 of the light emitting module 1130 may be variously arranged to provide various colors and brightness. For instance, the combination of the white LED, the red LED and the green LED can be arranged to achieve the high color rendering index (CRI).

The connection terminal 1120 is electrically connected to the light emitting module 1130 to supply power to the light emitting module 1130. According to the embodiment, the connection terminal 1120 has a shape of a socket screw-coupled with the external power source, but the embodiment is not limited thereto. For instance, the connection terminal 1120 can be prepared in the form of a pin inserted into the external power source or connected to the external power source through a wire.

Figure 8:
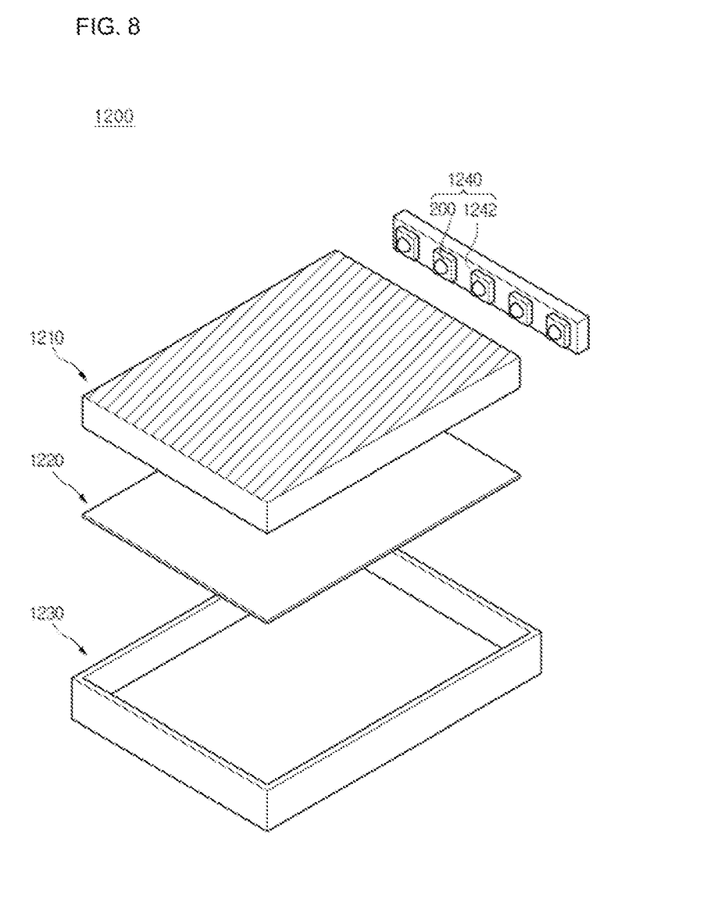
FIG. 8 is an exploded perspective view showing a backlight unit including a light emitting device package according to the embodiment.

FIG. 8 is an exploded perspective view of a backlight unit 1200 according to the embodiment. The backlight unit 1200 of FIG. 8 is an example of a lighting system, and the embodiment is not limited thereto.

The backlight unit 1200 according to the embodiment includes a light guide plate 1210, a light emitting module part 1240 to supply a light to the light guide plate 1210, a reflective member 1220 under the light guide plate 1210, and a bottom cover 1230 to receive the light guide plate 1210, the light emitting module part 1240, and the reflective member 1220 therein, but the embodiment is not limited thereto.

The light guide plate 1210 diffuses the light to provide surface light. The light guide plate 1210 may include a transparent material. For example, the light guide plate 1210 may include one of acryl-based resin, such as PMMA (polymethyl methacrylate), PET (polyethylene terephthalate), PC (polycarbonate), COC (cyclic olefin copolymer) or PEN (polyethylene naphthalate) resin.

The light emitting module part 1240 supplies the light to at least one side of the light guide plate 1210. The light emitting module part 1240 serves as the light source of the display device in which the backlight unit is installed.

The light emitting module part 1240 may make contact with the light guide plate 1210, but the embodiment is not limited thereto. In detail, the light emitting module part 1240 includes a substrate 1242 and a plurality of light emitting device packages 200 mounted on the substrate 1242. The substrate 1242 may make contact with the light guide plate 1210, but the embodiment is not limited thereto.

The substrate 1242 may be a printed circuit board (PCB) including a circuit pattern (not shown). In addition, the substrate 1242 may also include a metal core PCB (MCPCB) or a flexible PCB (FPCB), but the embodiment is not limited thereto.

In addition, the light emitting device packages 200 may be mounted on the substrate 1242 in such a manner that the light emission surface to emit the light is spaced apart from the light guide plate 1210 by a predetermined distance.

The reflective member 1220 may be disposed below the light guide plate 1210. The reflective member 1220 reflects the light, which travels downward through the bottom surface of the light guide plate 1210, upward, thereby improving the brightness of the backlight unit. For example, the reflective member 1220 may include PET, PC or PVC resin, but the embodiment is not limited thereto.

The bottom cover 1230 may receive the light guide plate 1210, the light emitting module part 1240, and the reflective member 1220 therein. To this end, the bottom cover 1230 has a box shape with an open, top surface, but the embodiment is not limited thereto.

The bottom cover 1230 may be manufactured through a press process or an extrusion process by using a metallic material or a resin material.

According to the light emitting device, the method of manufacturing the light emitting device, the light emitting device package and the lighting system of the embodiment, the light emitting efficiency can be improved and the optical characteristics of the LED can be enhanced.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
   a first conductive semiconductor layer;
   an active layer including a quantum well and a quantum barrier and disposed on the first conductive semiconductor layer; and
   a second conductive semiconductor layer on the active layer,
   wherein the active layer comprises:
   a first quantum well contacting the second conductive semiconductor layer;
   a second quantum well adjacent to the first quantum well; and
   a first quantum barrier between the first quantum well and the second quantum well,
   wherein a recombination rate of an electron-hole in the second quantum well is higher than a recombination rate of an electron-hole in the first quantum well,
   wherein an energy level of the first quantum barrier is higher than an energy level of the first quantum well, and
   wherein the energy level of the first quantum well is higher than an energy level of the second quantum well.

2. The light emitting device of claim 1, wherein the first quantum well has a compositional ratio different from a compositional ratio of the second quantum well.

3. The light emitting device of claim 1, wherein a compositional ratio of indium (In) in the first quantum well is lower than a compositional ratio of indium (In) in the second quantum well.

4. The light emitting device of claim 3, wherein the compositional ratio of indium (In) in the first quantum well is about 9 to 10% and the compositional ratio of indium (In) in the second quantum well is about 12%.

5. The light emitting device of claim 1, wherein the first quantum well is grown under a growth temperature higher than a growth temperature of the second quantum well.

6. The light emitting device of claim 1, wherein the first quantum well has a carrier transfer power higher than a carrier transfer power of other quantum wells.

7. The light emitting device of claim 6, wherein the first quantum barrier has a thickness less than a thickness of other quantum barriers.

8. The light emitting device of claim 7, wherein, when the thickness of the first quantum barrier is about 3 nm to 4 nm, the thickness of other quantum barriers is about 6 nm.

9. The light emitting device of claim 7, wherein, when the energy level of the first quantum well is higher than the energy level of the second quantum well, the first quantum barrier has a thickness sufficient for preventing a tunneling of carriers, which are injected from the second conductive semiconductor layer, through the first quantum barrier.

10. The light emitting device of claim 9, wherein, when the first quantum barrier is a GaN quantum barrier, the first quantum barrier has a thickness of about 3 nm to about 4 nm, and a tunneling of carriers through the first quantum barrier is prevented.

11. The light emitting device of claim 7, wherein, when the energy level of the first quantum well is higher than the energy level of the second quantum well for the electron-hole, the first quantum barrier has a thickness allowing a tunneling of carriers, which are injected from the second conductive semiconductor layer, through the first quantum barrier.

12. The light emitting device of claim 11, wherein the first quantum well is a sacrificed quantum well where a recombination of the electron-hole does not occur.

13. The light emitting device of claim 12, wherein a thickness of the first quantum barrier disposed between the first quantum well and the second quantum well adjacent to the first quantum well is about 3 nm or less, which allows a tunneling of carriers.

14. The light emitting device of claim 12, wherein the first quantum barrier has no function of a barrier in terms of quantum mechanics and serves as an interfacial surface holding layer that forms and holds a discontinuous and sharp interfacial surface between the first quantum well, which is the sacrificed quantum well, and the second quantum well.

15. The light emitting device of claim 1, further comprising a protective member formed at an outer peripheral portion of a lower portion of the second conductive semiconductor layer.

16. The light emitting device of claim 15, wherein the protective member includes at least one selected from the group consisting of ITO, IZO, IZTO, IAZO, IGZO, IGTO, AZO, ATO, ZnO, $SiO_2$, $SiO_x$, $SiO_xN_y$, $Si_3N_4$, $Al_2O_3$, $TiO_x$, $TiO_2$, Ti, Al, and Cr.

17. A light emitting device comprising:
an N-type semiconductor layer;
an active layer including a quantum well and a quantum barrier and disposed on the first conductive semiconductor layer; and
a P-type semiconductor layer on the active layer,
wherein the active layer comprises:
a first quantum well contacting the P-type semiconductor layer;
a second quantum well adjacent to the first quantum well; and
a first quantum barrier between the first quantum well and the second quantum well,
wherein a recombination rate of an electron-hole in the second quantum well is higher than a recombination rate of an electron-hole in the first quantum well,
wherein an energy level of the first quantum well is higher than an energy level of the second quantum well for the electron-hole, and
wherein the first quantum barrier has a thickness allowing a tunneling of carriers, which are injected from the second conductive semiconductor layer, through the first quantum barrier.

18. The light emitting device of claim 17, wherein the first quantum well is a sacrificed quantum well where a recombination of the electron-hole does not occur.

19. The light emitting device of claim 17, wherein a thickness of the first quantum barrier disposed between the first quantum well and the second quantum well adjacent to the first quantum well is about 3 nm or less, which allows a tunneling of carriers.

20. The light emitting device of claim 17, wherein the first quantum barrier has no function of a barrier in terms of quantum mechanics and serves as an interfacial surface holding layer that forms and holds a discontinuous and sharp interfacial surface between the first quantum well, which is the sacrificed quantum well, and the second quantum well.

* * * * *